(12) United States Patent
Li

(10) Patent No.: US 11,387,370 B2
(45) Date of Patent: Jul. 12, 2022

(54) AMORPHOUS SILICON THIN FILM TRANSISTOR AND METHOD FOR MANUFACTURING THE SAME

(71) Applicant: Shenzhen China Star Optoelectronics Technology Co., Ltd., Shenzhen (CN)

(72) Inventor: Jiaxin Li, Shenzhen (CN)

(73) Assignee: Shenzhen China Star Optoelectronics Technology Co., Ltd., Shenzhen (CN)

( * ) Notice: Subject to any disclaimer, the term of this patent is extended or adjusted under 35 U.S.C. 154(b) by 0 days.

(21) Appl. No.: 16/496,441

(22) PCT Filed: Apr. 22, 2019

(86) PCT No.: PCT/CN2019/083675
§ 371 (c)(1),
(2) Date: Sep. 22, 2019

(87) PCT Pub. No.: WO2020/206723
PCT Pub. Date: Oct. 15, 2020

(65) Prior Publication Data
US 2022/0052204 A1 Feb. 17, 2022

(30) Foreign Application Priority Data
Apr. 10, 2019 (CN) .......................... 201910283998.3

(51) Int. Cl.
*H01L 29/786* (2006.01)
*H01L 21/02* (2006.01)
(Continued)

(52) U.S. Cl.
CPC .... *H01L 29/78669* (2013.01); *H01L 21/0217* (2013.01); *H01L 27/127* (2013.01);
(Continued)

(58) Field of Classification Search
CPC .......... H01L 29/78669; H01L 21/0217; H01L 27/1222; H01L 27/127; H01L 29/66765; H01L 29/78606
See application file for complete search history.

(56) References Cited

U.S. PATENT DOCUMENTS

2007/0172998 A1 7/2007 Lee
2009/0225249 A1* 9/2009 Wang .................... H01L 27/124
257/E21.414
(Continued)

FOREIGN PATENT DOCUMENTS

CN 101009251 A 8/2007
CN 101526707 A 9/2009
(Continued)

*Primary Examiner* — Mohammed R Alam
(74) *Attorney, Agent, or Firm* — Nathan & Associates; Menachem Nathan

(57) ABSTRACT

The present invention provides an amorphous silicon thin film transistor and a manufacturing method of the amorphous silicon thin film transistor, which comprise: a substrate, a gate electrode layer, a gate insulating layer, an active layer, a source/drain electrode layer, an N+-doped layer, a protective insulating layer, and a passivation layer. The N+-doped layer is disposed between the active layer and the source/drain electrode layer. The protective insulating layer is disposed on the source/drain electrode layer. A channel is formed in the source/drain electrode layer and penetrates the N+-doped layer and the protective insulating layer. The passivation layer covers the channel and the protective insulating layer. The protective insulating layer and the source/drain electrode layer are flush with each other in the channel.

5 Claims, 5 Drawing Sheets

(51) Int. Cl.
    *H01L 27/12*         (2006.01)
    *H01L 29/66*         (2006.01)

(52) U.S. Cl.
    CPC .... *H01L 27/1222* (2013.01); *H01L 29/66765* (2013.01); *H01L 29/78606* (2013.01)

(56) References Cited

U.S. PATENT DOCUMENTS

2012/0315731 A1     12/2012    Lee
2013/0032794 A1      2/2013    Lee et al.

FOREIGN PATENT DOCUMENTS

| CN | 104681626 A | * | 6/2015 |
| CN | 107275343 A | | 10/2017 |
| CN | 108550625 A | | 9/2018 |

* cited by examiner

AMORPHOUS SILICON THIN FILM TRANSISTOR AND METHOD FOR MANUFACTURING THE SAME

FIELD OF DISCLOSURE

The present invention relates to a field of thin film transistor display devices and in particular, to an amorphous silicon thin film transistor and a method for manufacturing the same.

DESCRIPTION OF RELATED ART

In a bottom gate structure of an amorphous silicon (a-Si) thin film transistor (TFT) device, a dry etching step for forming a channel in an active layer is generally carried out before a photoresist material is removed by using a photoresist stripper. In recent years, there has been development in a reverse manufacturing method in which the photoresist material is removed first, and then a channel etching process using the photoresist material is performed. Advantages of the reverse manufacturing method are that an N+ doped layer (N+tail) in the channel can be completely removed, and a device width can be further reduced with the same or similar equipment and the same-level technology, and as a result, a narrow bezel and high transmittance are realized. However, a bottleneck in the reverse manufacturing method (stripper—channel Etch) is that, when the active layer is dry-etched to form the channel, a second electrode metal layer (usually made of copper or aluminum) is completely exposed, which causing a surface of the second electrode metal layer to be damaged by a plasma gas under an electric field. As shown in FIG. 1, the second electrode metal layer is discolored after etched by the plasma gas.

SUMMARY

A problem in a conventional reverse manufacturing method (stripper—channel Etch) is that, when an active layer is dry-etched to form the channel, a second electrode metal layer (usually made of copper or aluminum) is completely exposed, which causing a surface of the second electrode metal layer to be damaged by a plasma gas under an electric field. As shown in FIG. 1, the second electrode metal layer is discolored after etched by the plasma gas.

It is an objective of the present invention to provide an amorphous silicon thin film transistor and a manufacturing method thereof, which utilize a protective insulating layer to protect the source/drain electrode layer from being damaged by etching during dry etching.

Accordingly, the present invention provides an amorphous silicon thin film transistor, comprising: a substrate, a gate electrode layer, a gate insulating layer, an active layer, a source/drain electrode layer, an N+-doped layer, a protective insulating layer, and a passivation layer. The gate electrode layer is disposed on the substrate. The gate insulating layer is disposed on the gate electrode layer. The active layer is disposed on the gate insulating layer. The source/drain electrode layer is disposed on the active layer. The N+-doped layer is disposed between the active layer and the source/drain electrode layer. The protective insulating layer is disposed on the source/drain electrode layer. A channel is formed in the source/drain electrode layer and penetrates the N+-doped layer and the protective insulating layer. The passivation layer covers the channel and the protective insulating layer. The protective insulating layer and the source/drain electrode layer are flush with each other in the channel. The protective insulating layer is etched with cupric acid to make the protective insulating layer and the source/drain electrode layer flush with each other in the channel.

According to one embodiment of the present invention, the amorphous silicon thin film transistor further comprises a via hole formed in the passivation layer and a pixel electrode layer disposed on the gate insulating layer, wherein the pixel electrode layer is electrically connected to the source/drain layer through the via hole.

According to one embodiment of the present invention, the protective insulating layer is silicon nitride (SiNx), and the protective insulating layer has a thickness of between 500 angstroms and 1000 angstroms.

The present invention provides an amorphous silicon thin film transistor, comprising: a substrate, a gate electrode layer, a gate insulating layer, an active layer, a source/drain electrode layer, an N+-doped layer, a protective insulating layer, and a passivation layer. The gate electrode layer is disposed on the substrate. The gate insulating layer is disposed on the gate electrode layer. The active layer is disposed on the gate insulating layer. The source/drain electrode layer is disposed on the active layer. The N+-doped layer is disposed between the active layer and the source/drain electrode layer. The protective insulating layer is disposed on the source/drain electrode layer. A channel is formed in the source/drain electrode layer and penetrates the N+-doped layer and the protective insulating layer. The passivation layer covers the channel and the protective insulating layer. The protective insulating layer and the source/drain electrode layer are flush with each other in the channel.

According to one embodiment of the present invention, the amorphous silicon thin film transistor further comprises a via hole formed in the passivation layer and a pixel electrode layer disposed on the gate insulating layer, wherein the pixel electrode layer is electrically connected to the source/drain electrode layer through the via hole.

According to one embodiment of the present invention, the protective insulating layer is etched with cupric acid to make the protective insulating layer and the source/drain electrode layer flush with each other in the channel.

According to one embodiment of the present invention, the protective insulating layer is made of silicon nitride (SiNx), and the protective insulating layer has a thickness of between 500 angstroms and 1000 angstroms.

The present invention provides a method for manufacturing an amorphous silicon thin film transistor, comprising steps as follows:

S10: providing a substrate and forming a gate electrode layer on the substrate;
S20: forming a gate insulating layer on the gate electrode layer;
S30: forming an active layer on the gate insulating layer;
S40: forming a source/drain electrode layer on the active layer, wherein the source/drain electrode layer is made of copper or aluminum;
S50: forming an N+-doped layer between the active layer and the source/drain electrode layer;
S60: forming a protective insulating layer on the source/drain electrode layer, wherein a channel is formed in the source/drain electrode layer and penetrates the N+-doped layer and the protective insulating layer; and
S70: coating with a passivation layer in the channel and on the protective insulating layer, wherein the protective insulating layer and the source/drain electrode layer are flush with each other in the channel.

According to one embodiment of the present invention, in step S60, before the channel is formed, the source/drain electrode layer is coated with a photoresist material, and the protective insulating layer and the source/drain electrode layer are etched with cupric acid which contains an additive to form the channel.

According to one embodiment of the present invention, after step S60, the amorphous silicon thin film transistor after a photoresist material is removed is placed in a dry etching device for dry etching, and the protective insulating layer and the N+-doped layer are etched by a plasma gas to make the protective insulating layer and the N+-doped layer flush with each other.

According to one embodiment of the present invention, the additive comprises a plurality of fluoride ions.

According to one embodiment of the present invention, etching by the plasma gas comprises adding nitrogen trifluoride (NF3) and helium (He) to etch the protective insulating layer to make a thickness of the protective insulating layer to be of between 500 angstroms and 1000 angstroms.

According to one embodiment of the present invention, the method for manufacturing the amorphous silicon thin film transistor further comprises steps as follows:

S80: forming a via hole in the passivation layer; and
S90: forming a pixel electrode layer on the gate insulating layer, wherein the pixel electrode layer is electrically connected to the source/drain electrode layer through the via hole.

The present invention also has the following functions. The invention prevents a plasma gas from damaging a surface of the source/drain electrode layer during dry etching, thereby achieving consistent device performance, simplifying a manufacturing process, causing good stability, providing high transmittance of visible-light, and not affecting subsequent processes.

BRIEF DESCRIPTION OF DRAWINGS

In order to more clearly illustrate the embodiments of the present disclosure or related art, figures which will be described in the embodiments are briefly introduced hereinafter. It is obvious that the drawings are merely for the purposes of illustrating some embodiments of the present disclosure, and a person having ordinary skill in this field can obtain other figures according to these figures without an inventive work or paying the premise.

DETAILED DESCRIPTION OF EMBODIMENTS

References to "embodiments" in the detailed description mean that the specific features, structures or characteristics described in connection with the embodiments may be included in at least one embodiment of the invention. The same terms appearing in different places in the specification are not necessarily limited to the same embodiment, but should be understood as independent or alternative embodiments to other embodiments. In view of the technical solutions disclosed in the embodiments of the present invention, those skilled in the art should understand that the embodiments described herein may have other combinations or modifications in accordance with the embodiments of the present invention.

Figure 1:
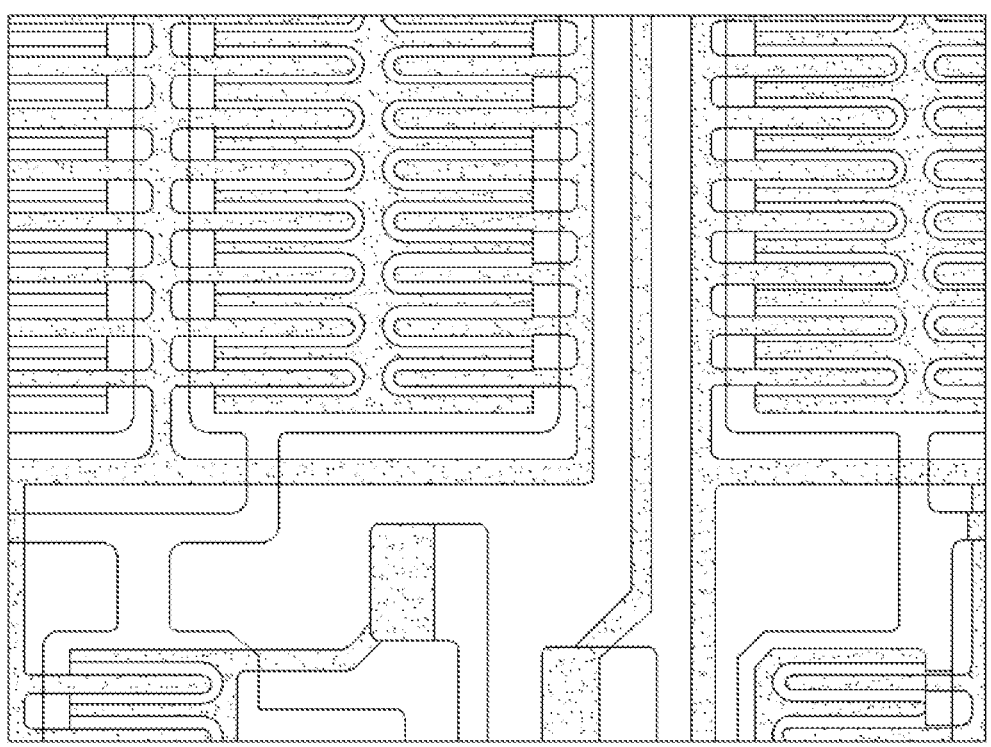
FIG. 1 is a schematic planar view illustrating a conventional amorphous silicon thin film transistor.
Figure 2:
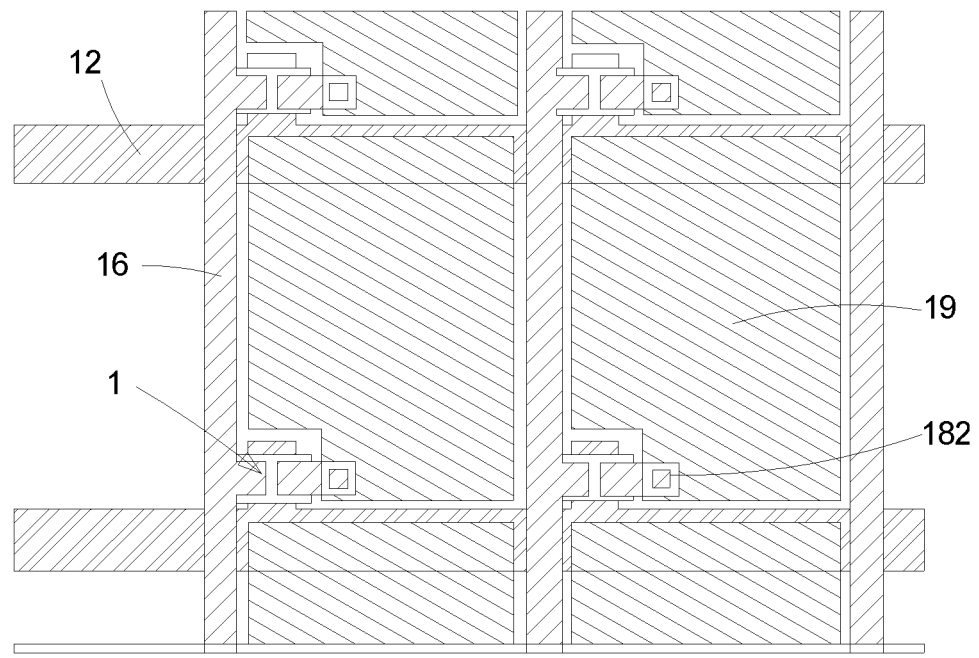
FIG. 2 is a schematic planar view illustrating an amorphous silicon thin film transistor of the present invention.
Figure 3:
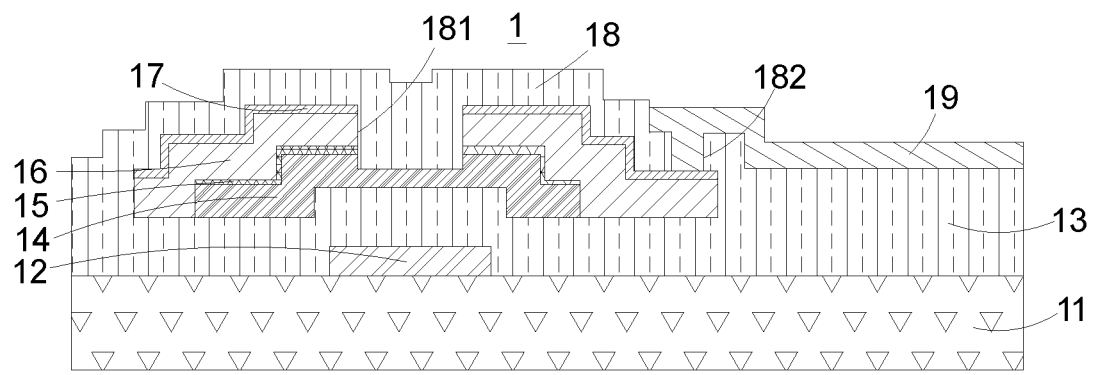
FIG. 3 is a cross-sectional view illustrating the amorphous silicon thin film transistor of the present invention.

Referring to FIGS. 2 and 3, FIG. 2 is a schematic planar view of an amorphous silicon thin film transistor of the present invention, and FIG. 3 is a cross-sectional view of the amorphous silicon thin film transistor of the present invention. As shown in FIG. 2 and FIG. 3, the present invention provides an amorphous silicon thin film transistor 1 (a-Si TFT) comprising a substrate 11, a gate electrode layer 12, a gate insulating layer 13, an active layer 14, a source/drain electrode layer 16, an N+-doped layer 15, a protective insulating layer 17, and a passivation layer 18. A plurality of amorphous silicon thin film transistors 1 are arranged in an array to form a display substrate (not illustrated). Referring to FIG. 2, the gate electrode layer 12 forms a scan line of the display substrate, and the source/drain electrode layer forms a signal line of the display substrate.

The substrate 11 is made of a rigid material or a flexible material. The rigid material is rigid glass or silicon wafer. The flexible material is one of polyethylene naphthalate, polyethylene terephthalate, polyimide, and flexible glass. A gate electrode layer 12 is disposed on the substrate 11. The active layer 14 is disposed on the gate insulating layer 13. The gate insulating layer 13 is disposed on the gate electrode layer 12. The gate insulating layer 13 is made of one or more of silicon oxide, silicon nitride, aluminum oxide, hafnium oxide, tantalum oxide, zirconium oxide, and an organic medium. The gate insulating layer 13 has a thickness of 5 nm to 400 nm. The source/drain electrode layer 15 is disposed on the active layer 14, wherein the source/drain electrode layer is made of metal containing copper or aluminum.

An N+-doped layer 15 is disposed between the active layer 14 and the source/drain electrode layer 16, wherein the N+-doped layer 15 is formed on the active layer 14 by a semiconductor doped with a high concentration of n-type impurities. A protective insulating layer 17 is disposed on the source/drain electrode layer 16, wherein a channel 181 is defined in the source/drain electrode layer 16 and penetrates the N+-doped layer 15 and the protective insulating layer 17. A passivation layer 18 covers the channel 181 and the protective insulating layer 17, wherein the protective insulating layer 17 and the source/drain electrode layer 16 are flush with each other in the channel 181. In the embodiment shown in FIGS. 2 and 3, a via hole 182 is defined in the passivation layer 18, and a pixel electrode layer 19 is disposed on the gate insulating layer 13. The pixel electrode layer 19 is electrically connected to the source/drain electrode layer 16 through the via hole 182.

The protective insulating layer 17 is etched with cupric acid to make the protective insulating layer 17 and the source/drain electrode layer 16 flush with each other in the channel 181. That is to say, the source/drain electrode layer 16 is protected by the protective insulating layer 17 to avoid being damaged by etching when entering a dry etching device, thereby achieving consistent and better device performance, simplifying a manufacturing process, causing good stability, realizing high visible-light transmission, and not affecting subsequent processes. The protective insulating layer 17 is silicon nitride (SiNx), and the protective insulating layer 17 has a thickness of between 500 angstroms and 1000 angstroms (Å), wherein 1 Å=10−10 meter=0.1 nm.

Referring to FIGS. 4A to 4D and FIG. 5, the present invention provides a method for manufacturing an amorphous silicon thin film transistor, comprising steps as follows:

S10: providing a substrate 11 and forming a gate electrode layer 12 on the substrate 11;

S20: forming a gate insulating layer 13 on the gate electrode layer 12;

S30: forming an active layer 14 on the gate insulating layer 13;

S40: forming a source/drain electrode layer 16 on the active layer 14, wherein the source/drain electrode layer 16 is made of copper or aluminum;

S50: forming an N+-doped layer 15 between the active layer 14 and the source/drain electrode layer 16;

S60: forming a protective insulating layer 17 on the source/drain electrode layer 16, wherein a channel 181 is formed in the source/drain electrode layer 16 and penetrates the N+-doped layer 15 and the protective insulating layer 17; and S70: coating with a passivation layer 18 in the channel 181 and on the protective insulating layer 17, wherein the protective insulating layer 17 and the source/drain electrode layer 16 are flush with each other in the channel 181.

Figure 4A:
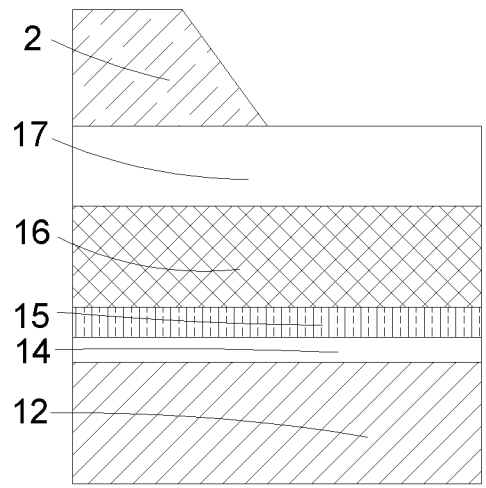
FIGS. 4A to 4D are cross-sectional views illustrating steps in a method for manufacturing the amorphous silicon thin film transistor according to the present invention.
Figure 4B:
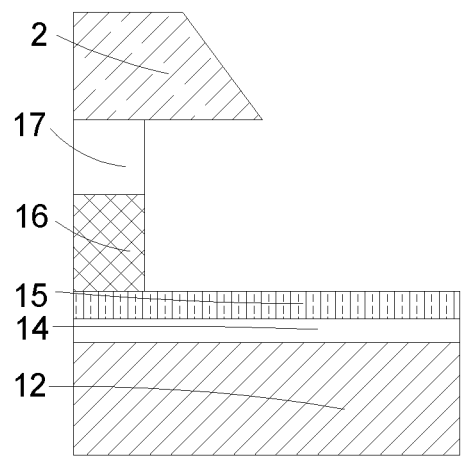
Figure 4C:
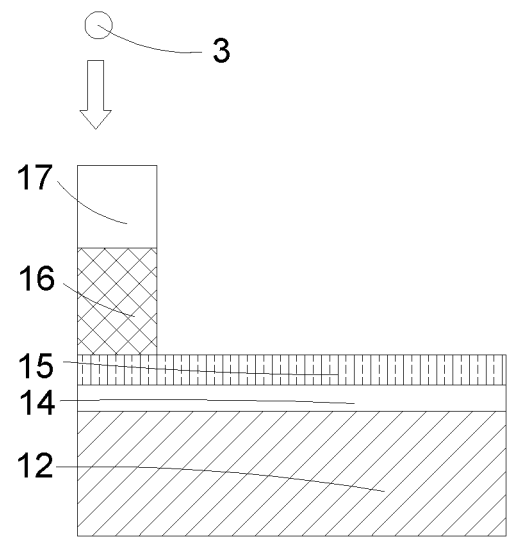
Figure 4D:
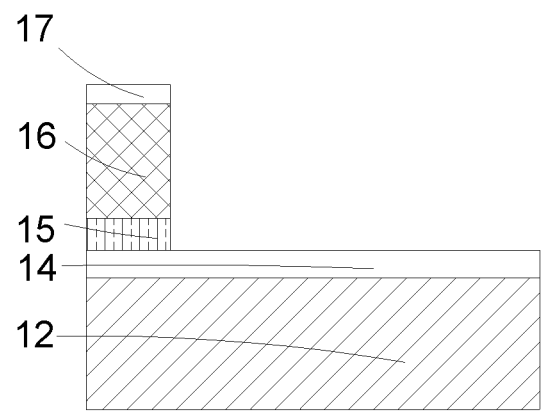
Figure 5:
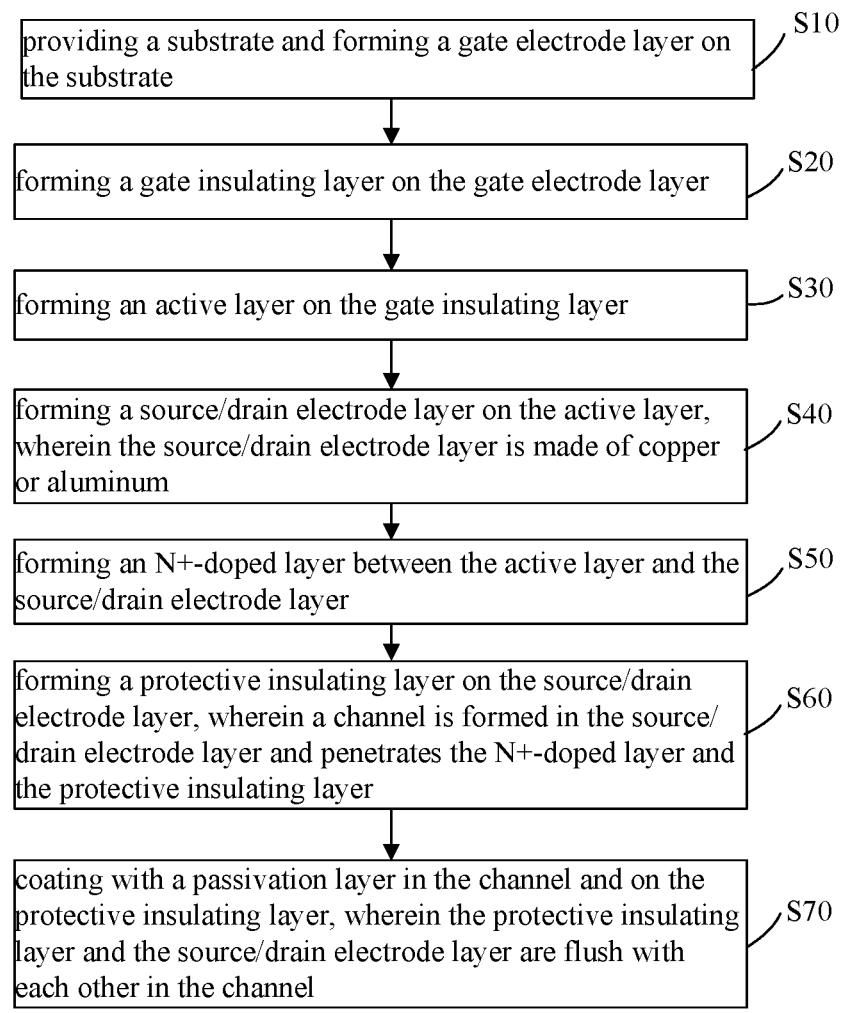
FIG. 5 is a process flow diagram illustrating the method for manufacturing the amorphous silicon thin film transistor according to the present invention.

Specifically, referring to FIG. 4A, in step S60, before the channel 181 is formed, the source/drain electrode layer 16 is coated with a photoresist material 2, and the protective insulating layer 17 and the source/drain electrode layer 16 are etched with cupric acid which contains an additive to form the channel 181. As shown in FIG. 4B and FIG. 4C, after step S60, the amorphous silicon thin film transistor 1 after the photoresist material 2 is removed is placed in a dry etching device for dry etching, and the protective insulating layer 17 and the N+-doped layer 15 are etched by a plasma gas 3 to make the protective insulating layer 17 and the N+-doped layer 15 flush with each other, as shown in FIG. 4D.

That is, as shown in FIG. 4A, the active layer (a-Si) 14 of a pixel region is removed by two wet etching and one dry etching in a four-mask process. Before the photoresist material 2 is removed, it is only necessary to reserve the protective insulating layer 17 on the source/drain electrode layer 16. As shown in FIG. 4B and FIG. 4C, removal of the photoresist material is carried out and followed by performing dry etching in a dry etching device. Most or all of the protective insulating layer 17 is removed according to a dry etching time and processing conditions to form a structure shown in FIG. 4D.

The protective insulating layer 17 is made of silicon nitride (SiNx), The protective insulating layer 17 is etched with cupric acid containing an additive such as a plurality of fluoride ions (F). That is to say, silicon nitride can be etched by increasing a content of fluoride ions in cupric acid. Etching by the plasma gas comprises adding nitrogen trifluoride (NF3) and helium (He) to etch the protective insulating layer to make a thickness of the protective insulating layer to be of between 500 angstroms and 1000 angstroms. Specifically, to perform dry etching, it substantially takes 1000 ppm of nitrogen trifluoride (NF3), added with 1500 ppm of helium (He) and a pressure of 30 mta, and a dry etching rate is about 20 A/second. The etching time varies depending on an actual thickness.

The manufacturing method of the present invention further comprises steps as follows.

S80: forming a via hole 182 in the passivation layer 18; and

S90: forming a pixel electrode layer 19 on the gate insulating layer 13, wherein the pixel electrode layer 19 is electrically connected to the source/drain electrode layer 16 through the via hole 182.

Therefore, in the present invention, the protective insulating layer 17 protects the source/drain electrode layer 16 from being damaged by etching when entering the dry etching device, thereby achieving better consistency of device performance, simplifying a manufacturing process, causing good stability, realizing high visible-light transmission, and not affecting a subsequent process.

It is to be understood that the above descriptions are merely the preferable embodiments of the present invention and are not intended to limit the scope of the present invention. Equivalent changes and modifications made in the spirit of the present invention are regarded as falling within the scope of the present invention.

What is claimed is:

1. A method for manufacturing an amorphous silicon thin film transistor, comprising steps as follows:

S10: providing a substrate and forming a gate electrode layer on the substrate;

S20: forming a gate insulating layer on the gate electrode layer;

S30: forming an active layer on the gate insulating layer;

S40: forming a source/drain electrode layer on the active layer, wherein the source/drain electrode layer is made of copper or aluminum;

S50: forming an N+-doped layer between the active layer and the source/drain electrode layer;

S60: forming a protective insulating layer on the source/drain electrode layer, wherein a channel is formed in the source/drain electrode layer and penetrates the N+-doped layer and the protective insulating layer, wherein in step S60, before the channel is formed, the source/drain electrode layer is coated with a photoresist material, and the protective insulating layer and the source/drain electrode layer are etched with cupric acid which contains an additive to form the channel; and S70: coating with a passivation layer in the channel and on the protective insulating layer, wherein the protective insulating layer and the source/drain electrode layer are flush with each other in the channel.

2. The method for manufacturing the amorphous silicon thin film transistor according to claim 1, wherein after step S60, the amorphous silicon thin film transistor with a photoresist material removed is placed in a dry etching device for dry etching, and the protective insulating layer and the N+-doped layer are etched by a plasma gas to make the protective insulating layer and the N+-doped layer flush with each other.

3. The method for manufacturing the amorphous silicon thin film transistor according to claim 1, wherein the additive comprises a plurality of fluoride ions.

4. The method for manufacturing the amorphous silicon thin film transistor according to claim 2, wherein etching by the plasma gas comprises adding nitrogen trifluoride (NF3) and helium (He) to etch the protective insulating layer to make a thickness of the protective insulating layer to be of between 500 angstroms and 1000 angstroms.

5. The method for manufacturing the amorphous silicon thin film transistor according to claim 1, comprising steps as follows:

S80: forming a via hole in the passivation layer; and

S90: forming a pixel electrode layer on the gate insulating layer, wherein the pixel electrode layer is electrically connected to the source/drain electrode layer through the via hole.

* * * * *